United States Patent [19]
Reindl
[11] 3,885,998
[45] May 27, 1975

[54] METHOD FOR THE SIMULTANEOUS FORMATION OF SEMICONDUCTOR COMPONENTS WITH INDIVIDUALLY TAILORED ISOLATION REGIONS

[75] Inventor: Klaus Reindl, Sherman, Tex.
[73] Assignee: Siemens Aktiengesellschaft, Munich, Berlin and Erlangen, Germany
[22] Filed: Oct. 16, 1972
[21] Appl. No.: 298,013

Related U.S. Application Data

[63] Continuation of Ser. No. 95,064, Dec. 4, 1970, abandoned.

[30] Foreign Application Priority Data

Dec. 5, 1969 Germany ........................... 1961247

[52] U.S. Cl. .................. 148/175; 29/577; 148/190; 148/191; 357/40; 357/44; 357/48; 357/52; 357/88; 357/90
[51] Int. Cl. .......................... H01l 7/36; H01l 27/02
[58] Field of Search ........... 148/174, 175, 190, 191; 29/577; 317/234, 235, 357, 40, 44, 48, 52, 88, 90

[56] References Cited

UNITED STATES PATENTS 3,547,716 12/1970 DeWitt et al. ...................... 148/175
3,748,545 7/1973 Beale ............................ 317/235 R

OTHER PUBLICATIONS

Viva et al., "Forming Buried Layer by Diffusion." IBM Tech. Discl. Bull., Vol. 11, No. 10, Mar. 1969, pp. 1,342–1,343.
Electronics, Electronics International, Oct. 28, 1968, pp. 204–205.
Murphy et al., "Collector Diffusion Isolated Integrated Circuits" Proc. IEEE, Vol. 57, No. 9, Sept. 1969, pp. 1,523–1,527.

*Primary Examiner*—L. Dewayne Rutledge
*Assistant Examiner*—W. G. Saba
*Attorney, Agent, or Firm*—Herbert L. Lerner

[57] ABSTRACT

Method for producing at least two adjacent semiconductor components, each having at least two regions of varying conductance type, the conductance type of the regions of the one semiconductor component being different from those of the other semiconductor component, one region of the one conductance type being surrounded by an insulating zone of the other conductance type electrically insulating the respective semiconductor component, the insulating zone and two regions adjacent the insulating zone forming a parasitic transistor having an electrical amplification lower than the electrical amplification of a normal transistor having a base region that is of the one conductance type; which includes covering with a masking layer a surface of a semiconductor base member at regions thereof intended for the production of semiconductor components thereat; producing highly doped zones of the other conductance type around the regions of the semiconductor base member covered by the masking layer, removing the masking layer and epitaxially applying semiconductor material of the one conductance type to the surface of the semiconductor base member, permitting the formation through diffusion and vapor deposition of a zone of the other conductance type below the regions provided for the semiconductor components and in the vicinity of the surface of the region of the base semiconductor body of the one conductance type that had been previously coated with a masking layer, producing an insulating wall of the other conductance type around the semiconductor material of the one conductance type so that the insulating wall, the highly doped zone and the weakly doped zone define an insulating tub of the other conductance type around the region of the one conductance type, and producing at least one zone of the other conductance type in the epitaxially applied semiconductor material.

2 Claims, 3 Drawing Figures

METHOD FOR THE SIMULTANEOUS FORMATION OF SEMICONDUCTOR COMPONENTS WITH INDIVIDUALLY TAILORED ISOLATION REGIONS

This is a continuation of application Ser. No. 95,064, filed Dec. 4, 1970, now abandoned.

The invention relates to a semiconductor component with at least two regions of variable conductance type whereby one region of one conductance type is enclosed by an insulating zone of the other conductance type to effect electrical insulation of the semiconductor component.

It is known to separate, from each other, the individual semiconductor components arranged on a chip. This is best effected by providing an insulating frame or ring around each component. In a known method for producing such electrically mutually insulated components, one starts with an original semiconductor body of one conductance type. Therein, individual regions of the other conductance type are produced through diffusion using the masking technique. The surface of the semiconductor original body is then provided with semiconductor material of one conductance type, by epitactic precipitation. The dopant diffuses from the regions of the other conductance type, into the epitactically growing material. Thereafter, insulating walls of the other conductance type are produced from the surface of the epitactic semiconductor material, up to the regions of the other conductance type. In this manner, one obtains individual regions of one conductance type in the epitactic semiconductor material, which are separated from one another and from the substrate by insulating tubs. Into these regions are finally placed the individual components such as, for example, transistors. This is done in a known manner.

This known method makes it possible, for example, to produce on one chip, npn and pnp transistors of high current amplification, whereby the collectors of the pnp transistors are insulated from each other.

It was found, however, that in the arrangement of the transistors, a single diffused resistor or a double diffused resistor (pinch resistor), in an insulating tub of one conductance type, where the base of the transistor and the resistance layers are of the same conductance type, results in parasitic pnp transistors.

This parasitic pnp transistor is constructed the same as a normal pnp transistor; is adjusted to high current amplification and its insulation tube functions as a collector. The parasitic transistor will therefore also have a high current amplification which is undesirable, especially when high current amplified pnp transistors and npn transistors with low collector emitter saturating voltage are provided on one chip.

It is an object of this invention to obviate the above difficulties.

Therefore, according to the invention, the electrical amplification of the parasitic transistor formed of the insulating region and of the two regions adjacent the insulating region, is kept lower than the electrical amplification of a normal transistor with a base of the one conductance type. This permits, in particular, the positioning on the same chip of resistors and of transistors with low parasitic current amplification.

A further feature of the invention is that a region of the semiconductor component of semiconductor material of one conductance type borders the insulating region on its second side, has a layer thickness between 5 and 10 $\mu$ and that the layer thickness of the insulating zone between the region of the one conductance type and the original semiconductor body is 2 to 5 $\mu$.

The semiconductor components, indicated in the invention and enclosed by an insulating zone, have an essentially lower effectiveness of the parasitic transistors. For example, the transistor has a thicker collector zone than the known transistors. This means also that the effectiveness of the parasitic transistor, where the collector zone of the transistor constitutes the base zone, is essentially lower.

According to a particularly preferred feature the region of semiconductor material of one conductance type, which is adjacent to the second side of the insulating zone, has a layer thickness of 8 $\mu$. The insulating zone may be p- or n-doped. Boron or phosphorus were found to be particularly suitable for doping material.

The semiconductor components, according to the invention, may be, for example, npn or pnp transistors, whose collector zone has a layer thickness of 5 to 10 $\mu$, preferably 8 $\mu$. It is particularly favorable to arrange on one chip an npn transistor according to the invention next to a known pnp transistor. The pnp transistor amplifying heavy current is then not disturbed with respect to its electric qualities by the parasitic pnp transistor of the npn transistor. The insulation tubs of both adjacent transistors are preferably interrupted by channel stoppers.

Moreover, the semiconductor components, according to the invention, may also be singly diffused resistors or pinch resistors. The resistors which are situated, for example, in a p-insulating tub, have only very low parasitic transistors which do not interfere electrically.

Finally, a further feature of the invention lies in a method for producing semiconductor components:

It is being suggested that on a surface of the original semiconductor body, the regions provided for the semiconductor components to be produced, be coated with a masking layer, are provided with highly doped zones of another conductance type around covered regins in the original semiconductor body of one conductance type. After removing the masking layer, the surface of the original semiconductor is epitactically coated with semiconductor material of one conductance type. A weakly doped region of the other conductance type then forms below the regions provided for the semiconductor components by diffusion and vapor deposition, preferably on and in the vicinity of the surface of the region of the original semiconductor body of one conductance type which was previously coated with a masking layer. An insulation wall of the other conductance type is produced around the semiconductor material of one conductance type so that the insulating wall, the highly doped zone and the weakly doped zone form an insulation wall of the other conductance type around the region of one conductance type and that, finally, at least one zone of the other conductance type is produced in the epitactically applied semiconductor material.

This preferred feature of the invention makes possible that transistors are constructed without additional diffusion and that said transistors have no parasitic side effects.

Other features and details of the invention are derived from the following description of an embodiment example, shown in the Figures, wherein:

Best Available Copy

In the Figures, corresponding parts are provided with the same reference numerals.

Figure 1:
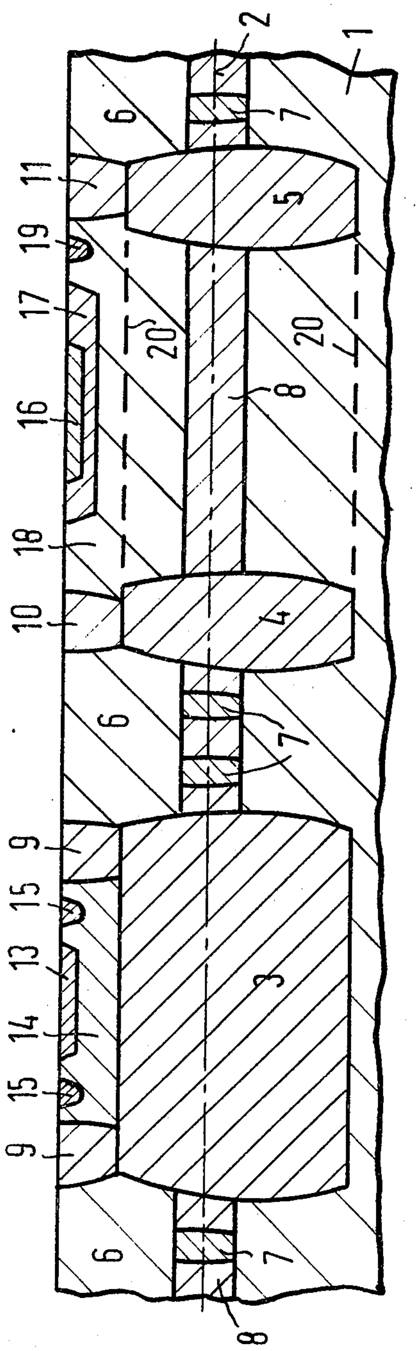
FIG. 1 is a section through a pnp and an npn transistor.

The left half of FIG. 1 shows a pnp transistor. Pt conducting regions 3, 4, and 5 are situated in an n-conducting original semiconductor body 1, whose surface 2 is shown in FIG. 1 by a dash-dotted line. Semiconductor material 6 is applied by epitaxy on the surface 2 and is n-conducting. Zones 3, 4 and 5 extend also into the epitactic layer 6. Between the adjacent zones, 3, 4, and 5, a weakly p-doped zone 8, which is interrupted by n-doped zones 7, is provided on and in the vicinity of the surface 2 of the original semiconductor body 1. The regions 7 function as channel stoppers.

Insulating walls 9, 10, 11 extend from the surface of the epitactic semiconductor material 6 to the highly doped zones 3, 4, 5. The insulating walls 9, 10, 11 are strongly p-doped and may be produced through epitaxy. The insulating walls 9 and the highly doped zone 3 form a first insulating tub. The insulating walls 10, 11, the highly doped zones 4, 5 and the zone 8 form a second insulating tub. Both insulating tubs are p-doped and surrounded by n-conducting semiconductor material.

The first insulating tub is provided with an emitter zone 13 and a base zone 14. The emitter zone 13 is p-doped, the base zone 14, which is comprised of the original epitactic semiconductor material 6, is n-doped while the strongly n-doped base contact is at 15.

An emitter zone 16, a base zone 17 and a collector zone 18 are situated in the second insulating tub. The emitter zone 16 is strongly n-doped, the base zone 17 is p-doped and the collector zone 18, which is formed by the epitactic semiconductor material 6, is n-doped while highly n-doped collector contact is shown at 19.

According to the invention, the distance between the zone 8 and the base zone 17, i.e., the thickness of the collector zone is 5 to 10 $\mu$ and is preferably 8 $\mu$. Boron was found to be especially suitable as the material used to dope zones 3, 4, 5.

The effect of the parasitic pnp-transistors formed of base zone 17, collector zone 18 and the insulating walls 10, 11, is very slight due to the great thickness of the collector layer. If the location on substrate 1, intended for the subsequent npn transistor is provided over its entire surface with a highly doped zone, such as for example zone 3 in the left half of FIG. 1, then the bottom of the insulating tub which is on the right in FIG. 1, would have the same layer thickness as the highly doped zones 4, 5 as shown in FIG. 1 by dash-dotted lines 20. This would produce a considerable layer thickness of the collector region 18 with the result that the parasitic pnp transistor would become equal with respect to its electrical characteristics to the pnp transistor, illustrated in the left half of the Figure.

FIG. 1 shows that the device shown in the right half may be operated also as a pinch resistor, rather than an npn transistor. By pinch resistor is meant a double diffused resistor. Zone 17 also represents the resistance layer of the pinch resistor. However, it is also possible to produce in the second insulating tub only a simple diffused resistor. In all these instances, as previously shown, the parasitic pnp transistor has only a very slight effect, which can be traced to the great layer thickness of the layer 18.

Figure 2:
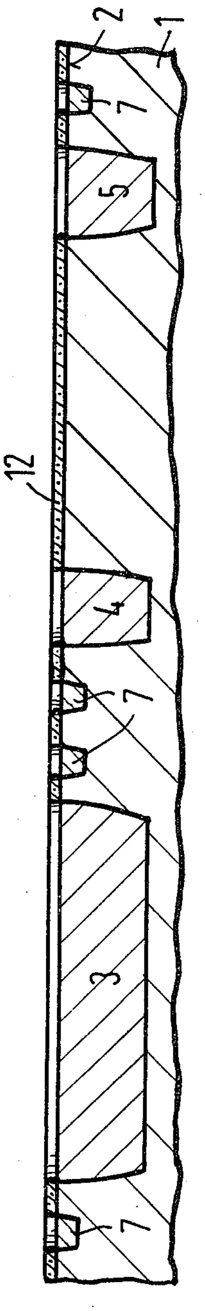
FIG. 2 is a section through the original semiconductor body prior to the removal of the masking layer.
Figure 3:
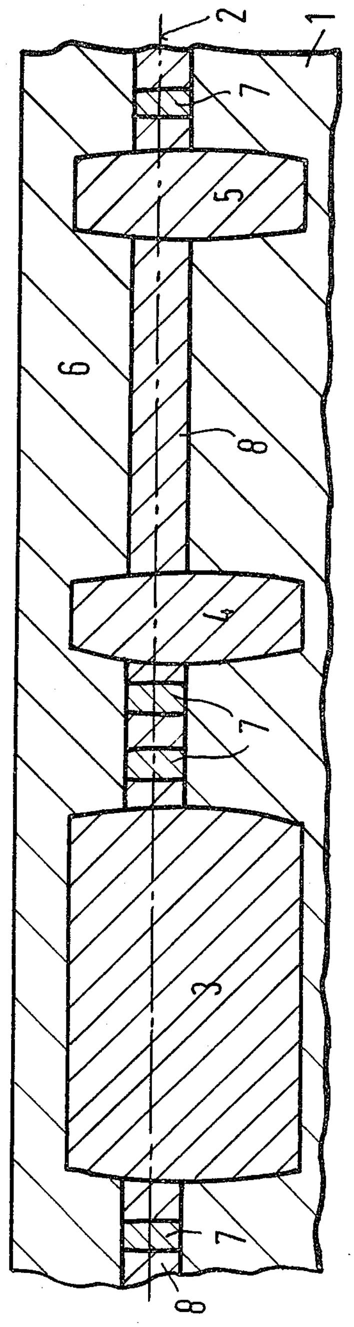
FIG. 3 is a section through the original semiconductor body and the semiconductor layer produced by epitaxy, prior to the production of the insulating walls.

The following discloses a method for producing the semiconductor components, according to the invention, as shown in greater detail in FIGS. 2 and 3.

FIG. 2 shows, first of all, strongly doped zones installed with the use of a masking layer 12 between the regions provided for the adjacent insulating tubs into the surface 2 of the semiconductor body 1. In the completed component, the zones 7 function as channel stoppers and electrically insulate the individual insulating tubs from each other. Zones 3, 4, 5 are subsequently produced in the original semiconductor body 1, prior to the application of the epitactic layer 6, up to the surface 2. Zones 3, 4, 5, 7 are preferably produced through diffusion, according to the masking technique.

After the growth of the epitactic semiconductor material 6, zones 3, 4, 5, 7 grow also by diffusion into the semiconductor material 6 so that they assume the shape illustrated in FIG. 3. Simultaneously, a p-conducting zone 8 forms through diffusion mainly along the boundary between the original semiconductor body 1 and the epitactic layer 6, and is interrupted by zones 7, between the subsequently adjacent components. Zone 8 is only weakly p-doped and has a slight layer thickness of 2 to 5 $\mu$. This is caused by the fact that only the marginal regions in the original semiconductor body 1, of the semiconductor component provided in the right half of FIG. 2, are provided with highly doped zones 4, 5. Zone 8, which constitutes the bottom of the insulating tub and is formed through diffusion and vapor deposition, preferably along the surface 2, results therefrom.

The individual semiconductor components may be produced in the insulating tubs, in a known manner, for example by means of diffusion, by employing the masking method.

The method disclosed in the embodiment example thus provides, without additional diffusion, a considerably thicker collector zone of the npn transistor and thus a considerably thicker base zone of the parasitic pnp transistor. The formation of the channels 8 is a result of the rapid lateral surface diffusion of boron. These channels 8 are utilized for the production of insulating tubs of the npn transistors. This is effected simply through the fact that the mask for the p-conducting insulating bottoms is so designed that no boron is applied below the npn transistors.

According to the invention, not only npn transistors can be produced in p-insulating tubs but, for example, also pnp transistors may be produced in n-insulating tubs. It is also possible to provide an n-conducting resistance layer in an n-insulating tub. Altogether, the semiconductor components produced according to the invention, show a very slight effect of the parasitic transistors.

I claim:

1. Method of producing at least two adjacent semiconductor components each having at least two regions of varying conductance type, the conductance type of the regions of the one semiconductor component being different from those of the other semiconductor component, one region of the one conductance type being surrounded by an insulating zone of the other conductance type electrically insulating the respective semiconductor component, said insulating zone and two regions adjacent said insulating zone forming a parasitic transistor having an electrical amplification lower than the electrical amplification of a normal transistor having a base region that is of said one conductance type; which comprises covering with a masking layer a surface of a semiconductor base member at regions thereof intended for the production of semiconductor components with individually tailored isolation regions; selectively diffusing to produce at least a highly doped annular zone and a second zone into the regions of the semiconductor base member not covered by the masking layer, which zones will form parts of isolating tubs for portions of a subsequently deposited semiconductor layer, removing the masking layer, epitaxially applying semiconductor material of one conductance type to the surface of the semiconductor base member, forming through diffusion and vapor deposition a thin weakly doped zone of the other conductance type at the interface of the epitaxial layer and substrata, said thin zone resulting from the rapid lateral surface diffusion from the highly doped regions, diffusing to produce at least two strongly doped insulating walls so that one insulating wall, the highly doped annular zone and the weakly doped zone define one insulating tub and the other insulating wall and other highly doped zone forms the second different insulating tub.

2. Method according to claim 1 which includes providing diffused zones of the one conductance type between adjacent insulating tubs for the respective semiconductor components and interrupting the zone of the other conductance type between the tubs and in said vicinity of the surface of the region of the base semiconductor body of the one conductance type that had been previously coated with the masking layer.

* * * * *